United States Patent
Kim

(10) Patent No.: US 9,615,473 B2
(45) Date of Patent: Apr. 4, 2017

(54) FLEXIBLE ELECTRONIC DEVICE

(71) Applicant: Samsung Electronics Co., Ltd., Gyeonggi-do (KR)

(72) Inventor: In-Soo Kim, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 287 days.

(21) Appl. No.: 14/272,715

(22) Filed: May 8, 2014

(65) Prior Publication Data

US 2015/0062840 A1 Mar. 5, 2015

(30) Foreign Application Priority Data

Aug. 30, 2013 (KR) .................. 10-2013-0104435

(51) Int. Cl.
- *H05K 5/02* (2006.01)
- *H05K 1/02* (2006.01)
- *H05K 5/00* (2006.01)
- *G06F 1/16* (2006.01)
- *H04M 1/02* (2006.01)

(52) U.S. Cl.
CPC ......... *H05K 5/0217* (2013.01); *G06F 1/1652* (2013.01); *H04M 1/0268* (2013.01); *H05K 1/028* (2013.01); *H05K 5/0086* (2013.01)

(58) Field of Classification Search
CPC .......... H05K 5/02; H05K 5/0217; H05K 1/02; H05K 5/00; H05K 5/0086; H05K 1/028
USPC .................................................. 361/679.21
See application file for complete search history.

(56) References Cited

U.S. PATENT DOCUMENTS

| | | |
|---|---|---|
| 4,130,987 A | 12/1978 | Schickedanz |
| 5,615,179 A | 3/1997 | Yamamoto et al. |
| 6,216,490 B1 | 4/2001 | Radley-Smith |
| 2001/0043514 A1 | 11/2001 | Kita |
| 2003/0030595 A1 | 2/2003 | Radley-Smith |
| 2006/0260842 A1 | 11/2006 | Sim et al. |
| 2009/0243756 A1* | 10/2009 | Stevenson ............... H01G 4/40 333/172 |
| 2010/0164888 A1 | 7/2010 | Okumura et al. |
| 2011/0089903 A1 | 4/2011 | Heikkinen |

(Continued)

FOREIGN PATENT DOCUMENTS

| | | |
|---|---|---|
| EP | 1 724 995 A2 | 11/2006 |
| EP | 2 202 624 A2 | 6/2010 |

(Continued)

*Primary Examiner* — Jenny L Wagner
*Assistant Examiner* — Michael P McFadden
(74) *Attorney, Agent, or Firm* — Cha & Reiter, LLC.

(57) ABSTRACT

A flexible electronic device is disclosed, including: a case frame, comprising a plurality of unit case frames space at regular intervals, engaged to move relative to one another, a substrate, disposed in an inner space defined by an interior of the case frame, and electrically coupling a plurality of unit substrates that are spaced at regular intervals using a flexible electrical coupler, a battery pack, disposed in the inner space, including a plurality of unit battery cells at regular intervals using a flexible electrical connection means, the unit battery cells configured to move relative to one another, and a flexible display, coupled to the case frame and positioned so that a display surface of the flexible display is exposed.

18 Claims, 8 Drawing Sheets

(56) References Cited

U.S. PATENT DOCUMENTS

| | | | |
|---|---|---|---|
| 2011/0310545 A1* | 12/2011 | Liu | G02F 1/133308 361/679.01 |
| 2012/0078999 A1 | 3/2012 | Andrew et al. | |
| 2012/0182677 A1 | 7/2012 | Seo | |
| 2012/0322516 A1* | 12/2012 | Kitagawa | F16J 15/025 455/575.1 |
| 2013/0083496 A1* | 4/2013 | Franklin | G06F 1/1626 361/749 |
| 2013/0335929 A1* | 12/2013 | Cavallaro | G06F 1/1652 361/749 |
| 2014/0231518 A1* | 8/2014 | Yosui | H01Q 1/2216 235/439 |

FOREIGN PATENT DOCUMENTS

| | | |
|---|---|---|
| KR | 10-2013-0055661 A | 5/2013 |
| WO | 01/64070 A1 | 9/2001 |
| WO | 2013/191859 A2 | 12/2013 |

* cited by examiner

FLEXIBLE ELECTRONIC DEVICE

CROSS-REFERENCE TO RELATED APPLICATION

The present application claims the benefit under 35 U.S.C. §119(a) to a Korean patent application filed in the Korean Intellectual Property Office on Aug. 30, 2013, and assigned Serial No. 10-2013-0104435, the entire disclosure of which is hereby incorporated by reference.

TECHNICAL FIELD

The present disclosure relates generally to a portable electronic device, and, more particularly, to a portable electronic device that is flexible.

BACKGROUND

Electronic devices have advanced to provide increasingly complex functions, even as they grow smaller and thinner, and advance toward easier portability. Small electronic devices are typically carried in a user's pocket, and alternatives are emerging that may be worn on a wrist, a head, or an arm of the user.

The wearable versions mounted on the human body principally include a main body for implementing a function of the electronic device, and at least one strap coupled to the main body having an appropriate size, shape and structure so as to secure the device to the human body.

For example, a strap may be coupled to the electronic device. However, when the wearable electronic device is used in a context where wearing it is unnecessary, the strap can become cumbersome. In such contexts, the strap may be regarded as inconvenient or unsightly.

Thus, the electronic device may be configured to to be wearable on the human body (or coupleable to other structures) in a manner that preserves the convenience and aesthetics of the electronic device when it is both worn and un-worn.

SUMMARY

In one aspect of the present disclosure, a flexible electronic device is provided, which is wearable without using a separate strap.

In another aspect of the present disclosure, a flexible electronic device is provided for achieving a corresponding function when the device is positioned into a bent state.

In still another aspect of the present disclosure, a flexible electronic device provides diverse usability.

In one aspect of the present disclosure, a flexible electronic device is disclosed, including: a flexible case frame, having a radius of available flexure, a flexible substrate, disposed in an inner space defined by an interior hollow of the case frame, a flexible battery pack, disposed in the inner space, and a flexible display, coupled the case frame and positioned so that a display surface of the flexible display is exposed.

In one aspect of the present disclosure, a flexible electronic device is disclosed, including: a case frame, comprising a plurality of unit case frames space at regular intervals, engaged to move relative to one another, a substrate, disposed in an inner space defined by an interior of the case frame, and electrically coupling a plurality of unit substrates that are spaced at regular intervals using a flexible electrical coupler, a battery pack, disposed in the inner space, including a plurality of unit battery cells at regular intervals using a flexible electrical connection means, the unit battery cells configured to move relative to one another, and a flexible display, coupled to the case frame and positioned so that a display surface of the flexible display is exposed.

The invention will become apparent to those skilled in the art from the following detailed description, which, taken in conjunction with the annexed drawings, discloses example embodiments of the invention.

BRIEF DESCRIPTION OF THE DRAWINGS

The example embodiments of the present disclosure will be more apparent from the following description, as taken in conjunction with the accompanying drawings, in which.

DETAILED DESCRIPTION

Figure 1:
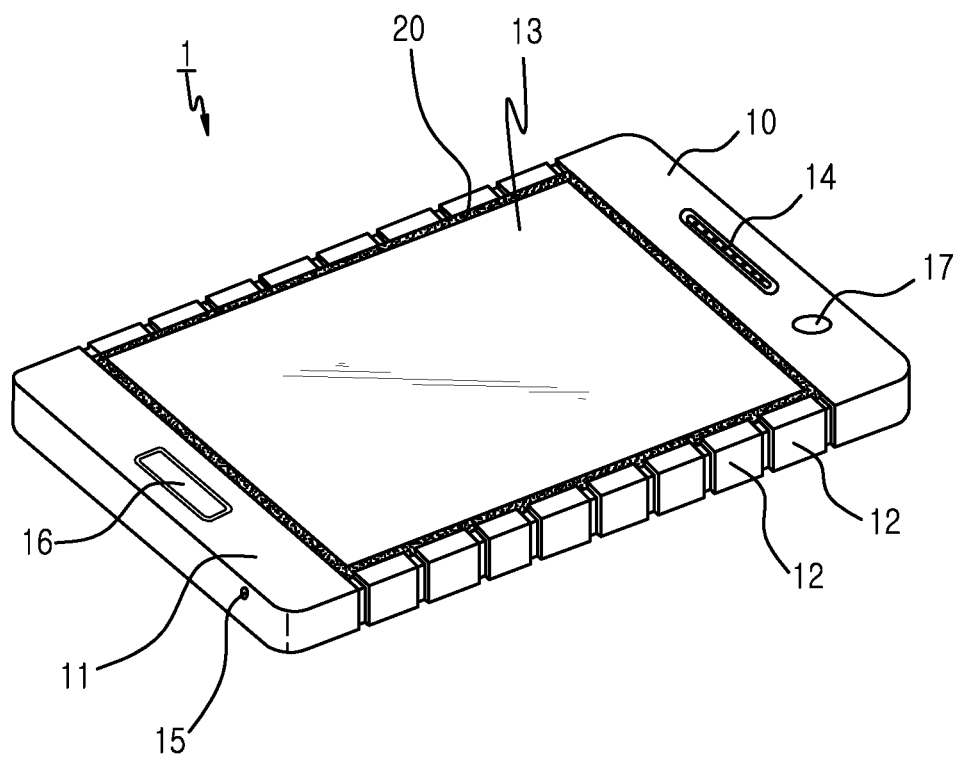
FIG. 1 is a perspective view of a front side of a flexible electronic device according to an example embodiment of the present disclosure.

Throughout the drawings, like reference numerals may be understood to refer to like parts, components and structures, when appropriate.

The following description with reference to the accompanying drawings is provided to assist in a comprehensive understanding of example embodiments of the invention as defined by the claims and their equivalents. It includes various specific details to assist in that understanding, but these are to be regarded as examples. Accordingly, those of ordinary skill in the art will recognize that various changes and modifications of the embodiments described herein can be made without departing from the ambit of the invention. In addition, descriptions of well-known functions and implementations may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of example embodiments of the present disclosure is provided for illustration purposes, and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

A fully flexible electronic device may include a flexible case frame having a certain radius of curvature, a flexible substrate disposed in an inner space of the case frame, a flexible battery pack disposed in the inner space of the case frame, and a flexible display exposed in part of the case frame.

The case frame may include a plurality of unit case frames configured to move relative to one another. The unit case frame may include a flat surface, a side surface extending perpendicularly "upwards" relative to the "left" and "right" sides of the flat surface, a coupler configured to protrude and couple to adjacent unit case frames on a flat surface, and a seating end formed opposing the coupler, and receiving the coupler of an adjacent unit case frame. The flexible electronic device may further include a hinge hole or a hinge protrusion formed in a contact portion formed on the coupler; and a hinge protrusion or a hinge hole formed in the seating end. The hinge protrusion may mechanically couple to the hinge hole when it is received by or penetrates the hinge hole.

The case frame may be formed of at least one of a synthetic resin, a metallic material, a glass material, a Glass Fiber Reinforced Plastic (GFRP), and a Carbon Fiber Reinforced Polymer (CFRP).

The substrate may be a Flexible Printed Circuit (FPC).

The substrate may be implemented by electrically coupling a plurality of unit substrates disposed at regular intervals using a flexible electrical coupler.

The electrical coupler means may be a FPC soldered on each unit substrate according to a predetermined width.

The unit substrates may be coupled using a separate subsidiary coupler means.

The subsidiary coupler means may include at least one of a conductive poron tape, a conductive tape, and a flexible metallic material. The subsidiary coupler may be electrically coupled to a ground of the unit substrate and used as an extended ground of the substrate.

The battery pack may be implemented by electrically coupler a plurality of unit battery cells at regular intervals using a flexible electrical coupler.

The electrical coupler means may be at least one coaxial cable.

An outermost battery cell of the battery cells may further include an access port exposed to outside to electrically couple with the electronic device.

The battery pack may be disposed within, embedded in or otherwise secured or attached to the electronic device.

The flexible electronic device may further include a sealing member for covering all of the unit battery cells. The sealing member may be formed of at least one of rubber, silicon, and urethane.

The electronic device may be a mobile communication terminal, such as a smart phone.

A fully flexible electronic device may include a case frame including a plurality of unit case frames configured to move relative to one another, a substrate disposed in an inner space of the case frame and electrically coupling a plurality of unit substrates at regular intervals using a flexible electrical coupler, a battery pack disposed in the inner space of the case frame and electrically coupling a plurality of unit battery cells disposed at regular intervals using a flexible electrical coupler, and a flexible display coupled to at least a part of the case frame.

Coupled portions of the unit case frames of the case frame, the unit substrates of the substrate, and the unit battery cells of the battery packet may be disposed correspondingly to facilitate flexure of the electronic device when it is fully assembled.

Herein, the electronic device can include a touch screen for inputting data through an input device and displaying data through a display on a single physical screen (i.e., the display).

Example embodiments of the present disclosure are not limited to the electronic device including the touch screen, but are applicable to various electronic devices including the touch screen, that is, a Personal Digital Assistant (PDA), a laptop computer, a mobile phone, a smart phone, a netbook, a Mobile Internet Device (MID), an Ultra Mobile Personal Computer (UMPC), a tablet PC, a navigation device, and an MP3 player.

Herein, the electronic device is described as flexible according to a transverse concave or convex curvature. However, other axis of curvature are considered. For example, the electronic device may be curve along a longitudinal convex or concave curvature. Furthermore, the electronic device may be configured to curve on two axis, including both the transverse (or latitudinal) concave or convex axis of curvature, and the longitudinal convex or concave axis of curvature.

Figure 2:
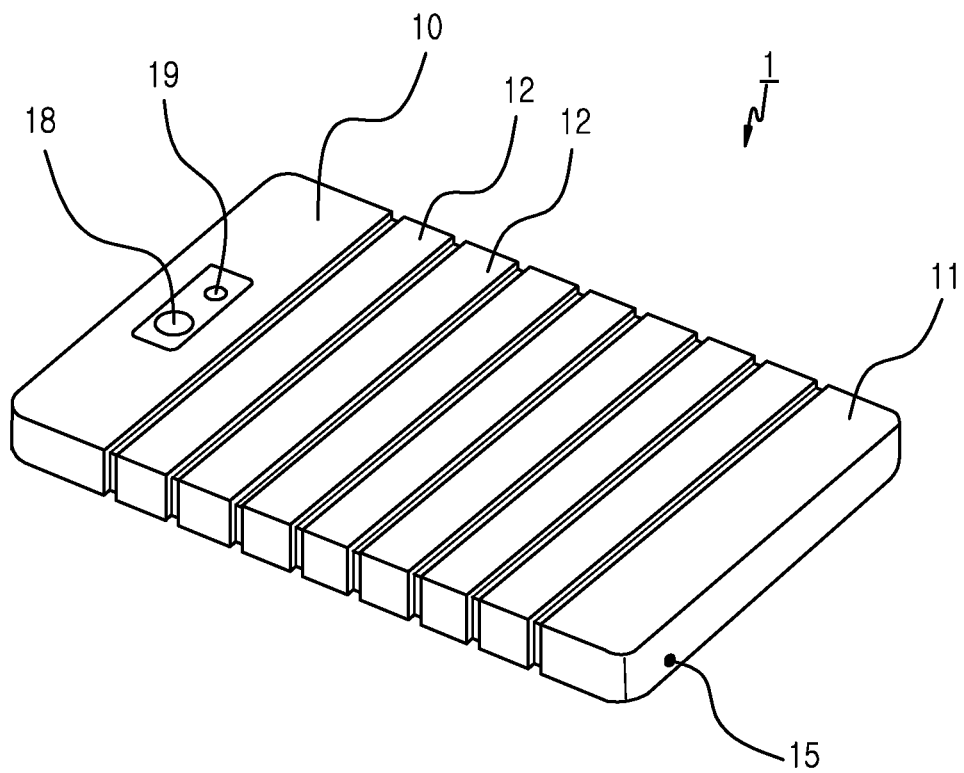
FIG. 2 is a perspective view of a rear side of the flexible electronic device according to an example embodiment of the present disclosure.

FIG. 1 is a perspective view of a front side of a flexible electronic device according to an example embodiment of the present disclosure, and FIG. 2 is a perspective view of a rear side of the flexible electronic device according to an example embodiment of the present disclosure. Referring to FIGS. 1 and 2, the electronic device 1 can include an upper support case frame 10 at a "top" end, and a lower support case frame 11 at a "bottom" end. A plurality of unit case frames 12 may be engaged between the upper support case frame 10 and the lower support case frame 11, and are configured to move relative to one another. The unit case frames 12 may be coupled to one another by a variety of coupling strategies, and may be configured to have a range of possible angles relative to one another. Accordingly, the connected unit case frames 12 may allow the electronic device 1 to bend in a concave or convex manner.

The upper support case frame 10 may include a speaker 14, and the lower support case frame 11 can include a microphone 15. Accordingly, the electronic device 1 may be used for voice or video telephony with another party as a mobile terminal and/or a smart phone.

The upper support case frame 10 can further include a sensor 17. The sensor 17 may detect an environment or environmental condition around the electronic device 1, and execute a corresponding function or state in response. For example, the sensor 17 can employ a light sensor, a proximity sensor, an image sensor, and so on.

The lower support case frame 11 can include, but is not limited to, a physical key button 16. The physical key button 16 can be disposed in at least one of a "side," a "top," and a "bottom" of the electronic device 1. The physical key button 16 may be utilized as any of a number of various button configurations, such as a home button, a slip/wake-up mode switch button, a volume-up/down button, and a function button. In other embodiments, the physical key button 16 may be replaced by a touch pad. Similarly, a plurality of physical key buttons 16 may be disposed at various locations of the electronic device 1.

The electronic device 1 may include a display 13 mounted on a space defined by the upper support case frame 10, the lower support case frame 11, and the unit support case frames 12. The display 13 can be a touch screen receiving touch input data and outputting visual data in via use of a touch sensor and any variation on, for example, a Liquid Crystal Display (LCD) module. The display 13 may include a flexible display module. In addition to the flexible display module, the display 13 may further include a flexible window for protecting the display module.

The electronic device 1 may further include a damping member 20 between the display 13 and the upper support case frame 10, the lower support case frame 11, and the unit case frames 12. The damping member 20 may provide a damping effect, and an environmental seal. The damping member 20 may be disposed at edges of the case frames 10, 11, and 12, as situated along a border of the display 13. The damping member 20 can be formed of an elastic material for accommodating the flexure of the unit case frames 12. The damping member 20 can be inserted and molded in the case frames 10, 11, and 12. The damping member 20 can be formed of a material having good flexibility such as silicon, rubber, and urethane.

The electronic device 1 can further include at least one camera 18 including a flash 19 in its rear side. The camera 18 may also be installed also in the front side of the electronic device 1. The camera 18 can be used for the video telephony and general video capture. When two or more cameras 18 are disposed according to a known regular interval, they may be equipped to capture a 3-dimensional "3D" image.

In the above described embodiment, the movable unit case frames 12 are interposed between the upper support case frame 10 and the lower support case frame 11 to a particular defined width. However, it is contemplated that the unit case frames 12 may complete the exterior of the electronic device 1 without use of the upper and lower support case frames 10 and 11.

Figure 3:
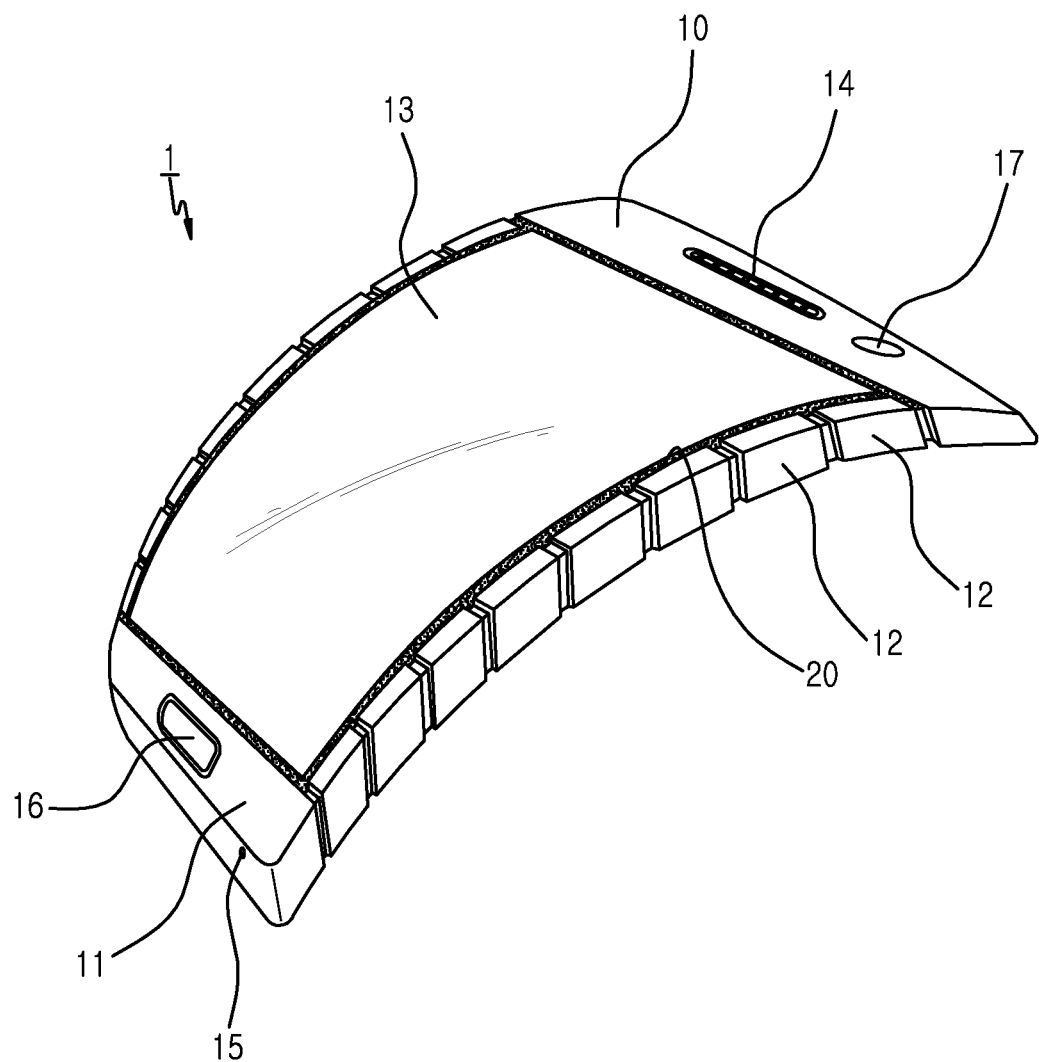
FIG. 3 is a perspective views of a bent state of the flexible electronic device according to an example embodiment of the present disclosure.
Figure 4:
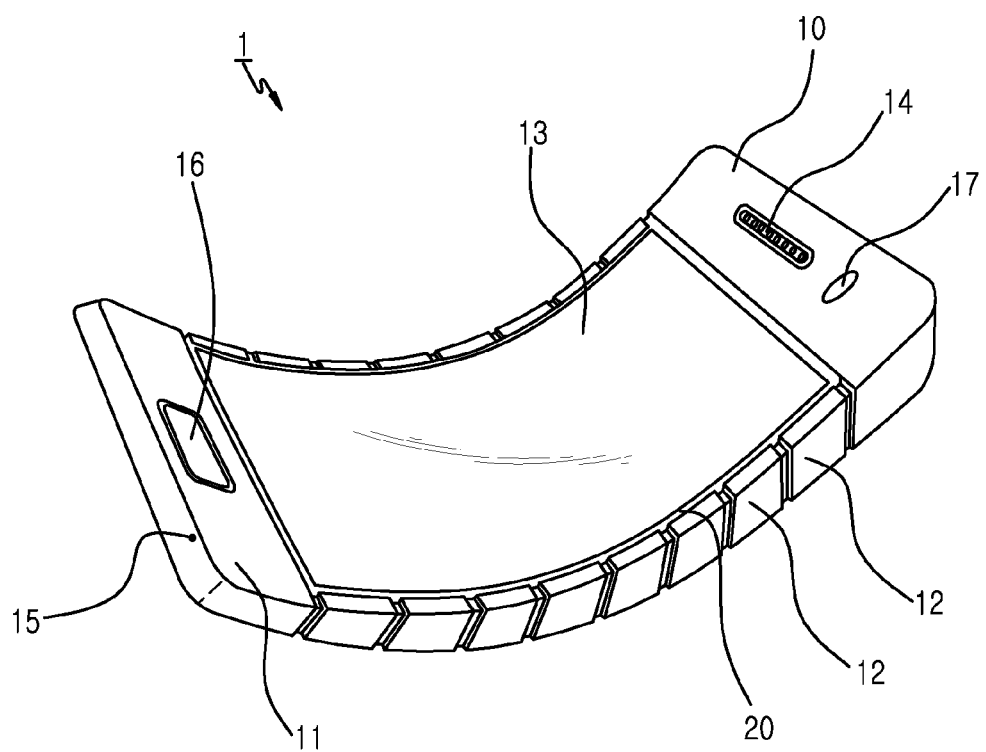
FIG. 4 is a perspective views of a bent state of the flexible electronic device according to an example embodiment of the present disclosure.

FIGS. 3 and 4 are perspective views of convex and concave bent states of the flexible electronic device according to an example embodiment of the present disclosure.

Referring now to FIGS. 3 and 4, the electronic device 1 can be bent in a curved shape having a convex or concave curvature, as facilitated by the unit case frames 12. The flexure may facilitate the electronic device 1 to be attached to the human body or a structure. In one embodiment, the electronic device 1 may maintain the flexure. In another embodiment, when an applied external force is removed from the bent electronic device 1, the electronic device 1 may return to its original non-flexure state.

Figure 5:
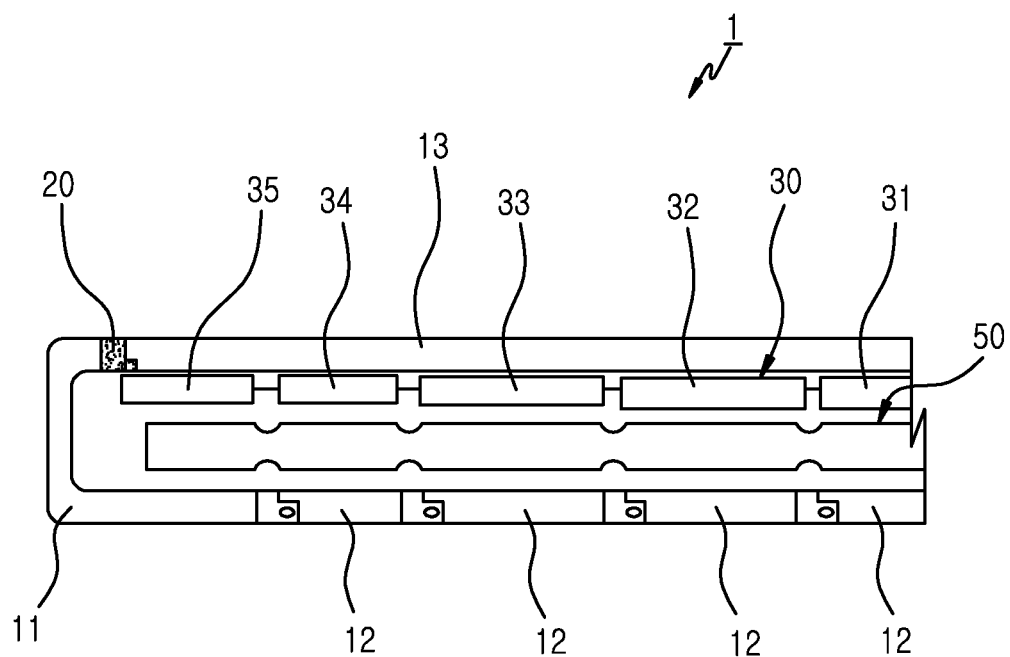
FIG. 5 is a cross-sectional view of the flexible electronic device according to an example embodiment of the present disclosure.

FIG. 5 is a cross-sectional view of the flexible electronic device according to an example embodiment of the present disclosure.

Referring to FIG. 5, the electronic device 1 includes an inner space defined by the connected upper support case frame 10 (not shown), lower support case frame 11, and unit case frames 12. Components of the electronic device 1 may be mounted within this space.

The electronic device 1 can include a substrate 30 for mounting an electronic components (310 in FIG. 7), a battery pack 50 for supplying power to the electronic device 1, and the display 13 for inputting or inputting/outputting the data. These three components may be flexible, so that they may flex along with the unit case frames 12, whereas other components of the electronic device may not be affected by the flexure of the flexible electronic device 1.

The substrate 30 and the battery pack 50 may flex based on the flexure of the electronic device 1. For example, when the electronic device 1 may return to an original state when an applied external force is removed, the substrate 30 and the battery pack 50 may also return to their original state when the applied external force causing the flexure is removed. In another embodiment, when the electronic device 1 remains in the flexed state when the applied external force is removed, the substrate 30 and the battery pack 50 may also remain flexed when the applied external force causing the flexure is removed.

Figure 6:
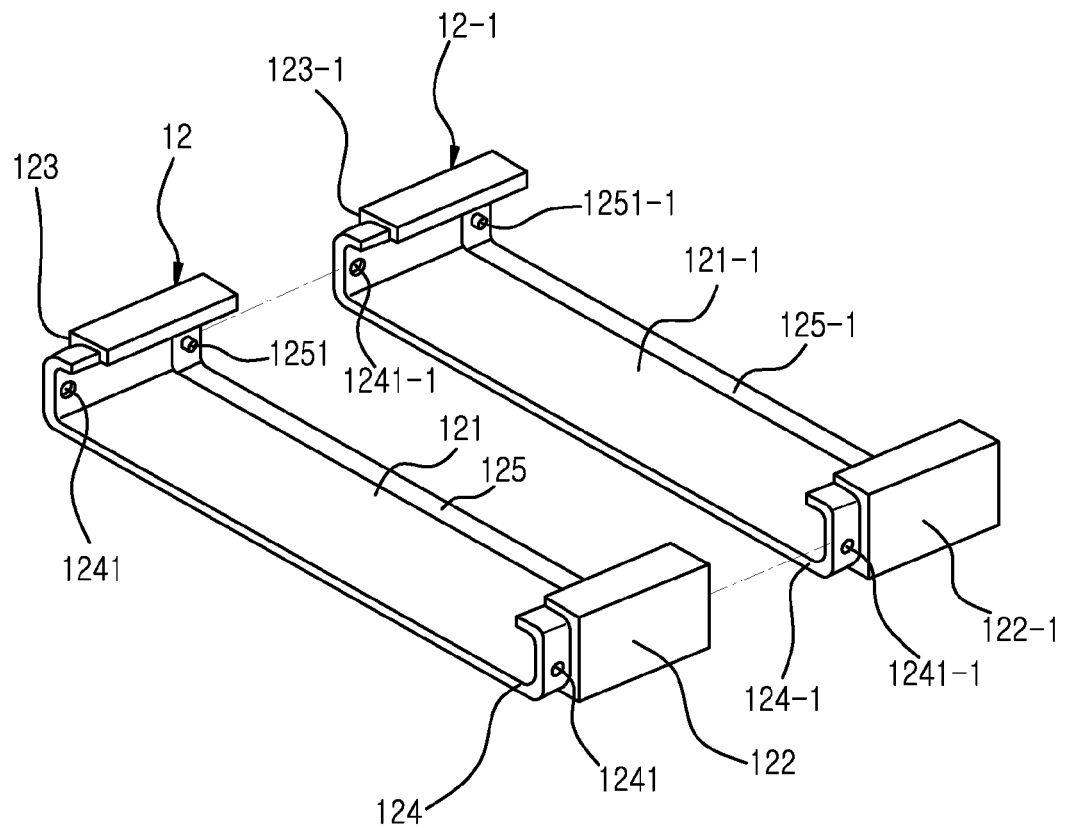
FIG. 6 is an exploded view of unit case frames of the flexible electronic device according to an example embodiment of the present disclosure.

FIG. 6 is an exploded view of the unit case frames of the flexible electronic device 1 according to an example embodiment of the present disclosure. Referring now FIG. 6, two unit case frames are given different reference numerals 12 and 12-1 to explain their engagement. It is apparent that the other unit case frames of the electronic device 1 may be coupled in the same manner.

Referring to FIG. 6, the unit case frame 12 may include a flat surface 121 of a certain length that, when coupled with other unit case frames, will form a substantial portion of the rear surface of the assembled electronic device 1. Similarly, the unit case frame 12 includes side surfaces 122 and 123 that are extend from the flat surface 121 and rise perpendicularly from either side of the flat surface 121, thus forming substantial portions of the sides of the assembled electronic device 1. The side surfaces 122 and 123 may terminate in another perpendicular "inward" bend towards a front-side of the assembled electronic device, thus defining a surface and/or space for accommodating, coupling or securing of the display 13 (not shown).

A coupler 124 may protrude from a lateral end of the flat surface 121 of the unit case frame 12. Similarly, a seating end 125 may be formed on the distal lateral end of the flat surface 121. The seating end 125 may be shaped so as to securely couple with the coupler 124-1 of the other unit case frame 12-1. As depicted in FIG. 6, the seating end 125 may present a relatively "lower" surface than the flat surface 121-1, and thereby accommodate a partial coupling of the seating end 125 to the couple 124-1 protruding from the flat surface 121-1 of the adjacent unit case frame 12-1.

A hinge hole 1241 may be formed on the sides of the coupler 124, and a hinge protrusion 1251 may be formed in the left and right sides of the seating end 125. Therefore, the hinge protrusions 1251 may be configured to mechanically engage the hinge holes 1241-1 of the other unit case frame 12-1, when the coupler 124-1 of the other unit case frame 12-1 is seated in the seating end 125 of the unit case frame 12. In one embodiment, utilizing hinged coupling allows each unit case frames 12 to rotate up to a certain angle, facilitating the flexure of the electronic device 1. In one embodiment, the unit case frames 12 may be assembled using press fit, facilitating an electronic device 1 that may remain in a flexed state without an external application of force. Alternatively, a separate elastic protrusion may be formed at the coupled portion of the unit case frames 12, and a seating groove may be formed for receiving the elastic protrusion, and spaced at regular intervals along the rotation trajectory. With this configuration, the electronic device 1 may maintain a flexed state even without the application of an external force.

It should be understood that while the above-described embodiment of the present disclosure illustrated the coupler 124 of the unit case frame 12 including the hinge hole 1241 and the seating end 125 includes the hinge protrusion 1251, the reverse arrangement may also be utilized, in which the coupler 124 may include the hinge protrusion 1251, and the seating end 125 including the hinge hole.

Figure 7:
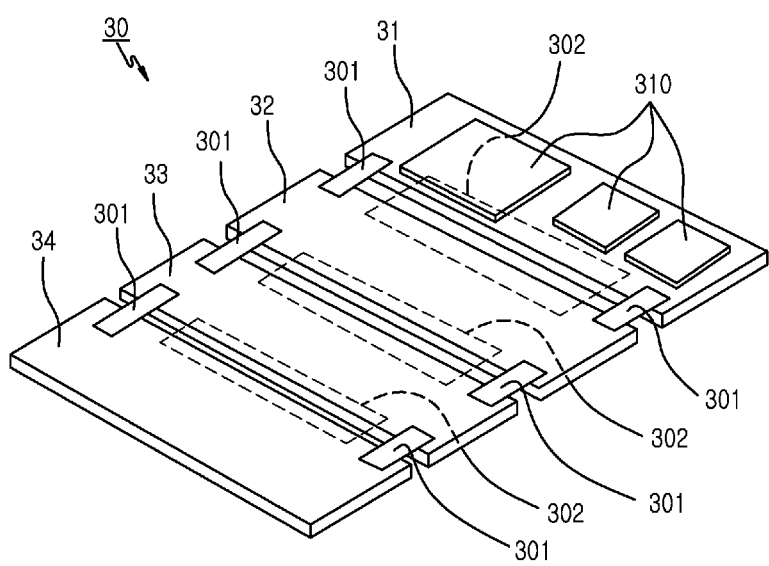
FIG. 7 is a perspective view of a substrate of the flexible electronic device according to an example embodiment of the present disclosure.

FIG. 7 is a perspective view of the substrate of the flexible electronic device according to an example embodiment of the present disclosure.

Referring to FIG. 7, the substrate 30 may be flexible in tandem with the flexible electronic device 1. A plurality of unit substrates 31-34 may form the substrate 30, and may be arranged at regular intervals. The substrate 30 may electrically couple a plurality of unit substrates 31-34, using, for example, a Flexible Printed Circuit "FPC" 301, thereby allowing the substrate 30 to flex at each FPC 301. Alternatively, the substrate 30 may be formed entirely by the FPC 301, in which case there would be no need to segment the substrate 30 into the plurality of unit substrates 31-34.

The unit substrates 31-34 can be soldered and secured using the FPC 301. The FPC 301 can be secured and coupled in pairs, which may be situated at, but not limited to, the ends of the unit substrates 31-34. The FPC 301 may be secured over the full surface of the unit substrates 31-34. The unit substrates 31-34 may be connected by various coupling connection means, such as thin cable. For example, the unit substrates 31-34 may employ various electrical coupling means for electrically intercoupling the unit substrates 31-34.

While the unit substrates 31-34 facilitate the flexure of the substrate 30 via the coupled FPCs 301, the substrate 30 may further include a separate subsidiary coupler 302, thereby accounting for the possible decoupling of the respective FPCs 301. The subsidiary coupler 302 may include conductive tape for coupling the unit substrates 31-34. For example, the subsidiary coupler 302 may be attached to a "back" side of the unit substrates 31-34 to connect electrically ground regions of the unit substrates 31-34 each other. For example, when the unit substrates 31-34 define a particular space, the subsidiary couplers 302 may be attached to the "top" side, to facilitate use of a greater area of the ground region of the substrate 30. Hence, the subsidiary coupler 302 can employ, for example, a conductive "Poron" tape or some flexible conductive material. Therefore, the conductive subsidiary coupler 302 may be used an extended electrical ground for the unit substrates 31-34.

Figure 8:
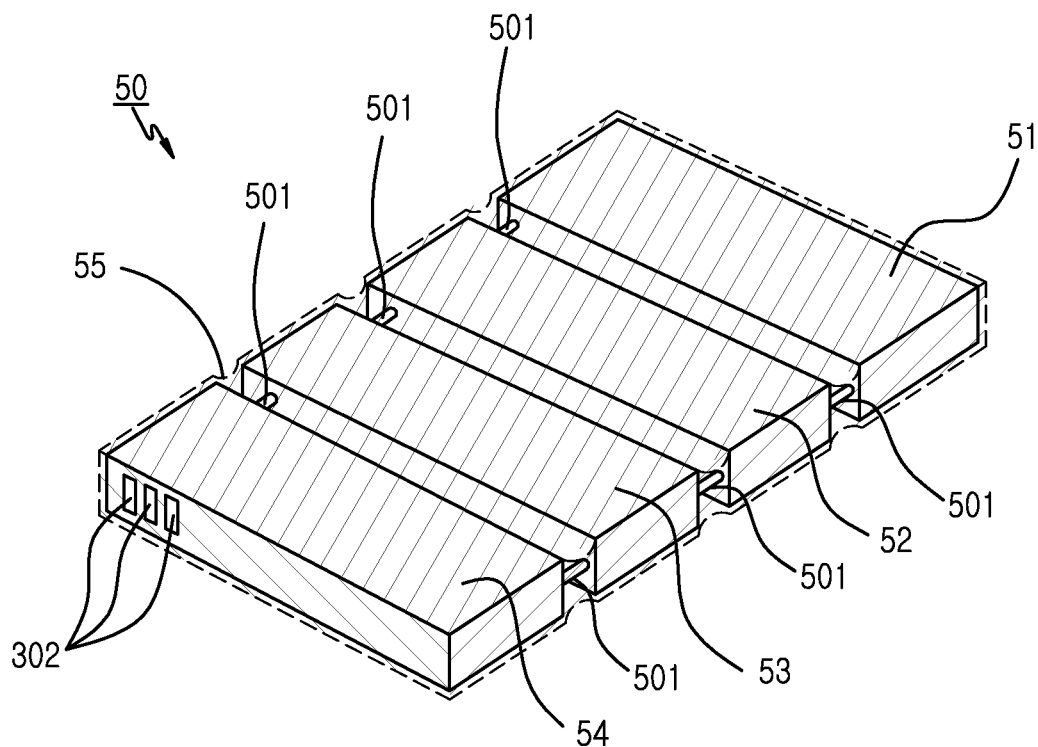
FIG. 8 is a perspective view of a battery pack of the flexible electronic device according to an example embodiment of the present disclosure.

FIG. 8 is a perspective view of the battery pack of the flexible electronic device according to an example embodiment of the present disclosure.

Referring to FIG. 8, the battery pack 50 includes a plurality of unit battery cells 51-54 coupled at regular intervals. The unit battery cells 51-54 can be coupled using an electrical coupling means 501. The unit battery cells 51-54 can be electrically connected using the electrical coupling means 501, such as coaxial cable. For example, the battery cell 50 may be electrically coupled using any flexible electric coupling means that is known in the art.

While the unit battery cells 51-54 are electrically coupled by a pair of the coaxial cables 501 in FIG. 8, they may be electrically coupled by one or more coaxial cables.

All of the unit battery cells 51-54 can be covered by a single sealing member 55. The sealing member 55 can prevent fluid leakage of the battery cells 51 through 54, and enhance the exterior by showing the single battery pack. The sealing member 55 is formed of an elastic material so that the unit battery cells 51 through 54 can be bent together when the electronic device 1 is bent. For example, the sealing member 55 can be formed of various elastic materials such as rubber, urethane, and silicon.

An access port 302 can be exposed in the outermost battery cell 54 of the unit battery cells 51 through 54. The access port 302 of the battery pack 50 can be coupled to a connector of the electronic device 1. The battery pack 50 can be disposed within the electronic device 1. The battery pack 50 may be attached and detached to and from the electronic device 1.

The electronic device 1, when assembled, possessed components that have aligned rigid and flexible components having corresponding ranges of desired curvature, including the case frames 10, 11, and 12, the substrate 30, and the battery pack 50. Accordingly, when the electronic device 1 is flexed, the case frames 10-12, substrate 30 and battery pack 50 flex as well, and thereby do not hinder the flexure of the electronic device 1.

The connection portions of the unit components are unified in the electronic device so as to optimize the flexure of the electronic device 1.

The unit components of the electronic device 1 may remain bent in the absence of applied external force, or return to the original state by themselves with the removal of the applied external force.

The electronic device 1 can be arbitrarily bent, and maintain the bent state. Thus, the electronic device 1 can be coupled to the human body (or some other structure) without need for a separate strap, thus providing particular usability to the user.

While the invention has been shown and described with reference to certain example embodiments thereof, it will be understood by those skilled in the art that various changes in form and details may be made therein without departing from the ambit of the invention as defined by the appended claims and their equivalents.

What is claimed is:

1. A flexible electronic device comprising:
a flexible case frame, having a radius of available flexure;
a flexible substrate, disposed in an inner space defined by the case frame;
a flexible battery pack, disposed in the inner space; and
a flexible display, coupled to the flexible case frame and positioned so that a display surface of the flexible display is exposed,
wherein a damping member is interposed between an edge of the flexible display and a portion of the flexible case frame at least partially enclosing a circumference of the flexible display, and the case frame comprises a plurality of intercoupled unit case frames configured to move relative to one another, each of the plurality of intercoupled unit case frames comprises:
a flat surface;
a first side surface and an opposing second side surface, each side surface extending perpendicularly from side-distal ends of the flat surface;
a coupler, protruding from a top-distal end of the flat surface; and
a seating end, recessing from a bottom-distal end of the flat surface, the seating end formed in opposition to the coupler,
wherein the coupler of a first of the plurality of intercoupled unit case frames is configured to at least partially couple with a step formed between the bottom-distal end and the seating end of a second of the plurality of intercoupled unit case frames that is adjacent to the first of the plurality.

2. The flexible electronic device of claim 1, further comprising at least one of:

hinge holes formed in the coupler, and hinge protrusions formed in the seating end; and hinge holes formed in the seating end, and hinge protrusions formed in the coupler, wherein:

the hinge holes are mechanically coupled to the hinge protrusions and facilitate flexure of the case frame.

3. The flexible electronic device of claim 1, wherein the case frame is formed of at least one of a synthetic resin, a metallic material, a glass material, a Glass Fiber Reinforced Plastic (GFRP), and a Carbon Fiber Reinforced Polymer (CFRP).

4. The flexible electronic device of claim 1, wherein the substrate is a Flexible Printed Circuit (FPC).

5. The flexible electronic device of claim 1, wherein the substrate comprises a plurality of electrically coupled unit substrates that are spaced at regular intervals, and are mechanically and electrically coupled through a flexible electrical coupler.

6. The flexible electronic device of claim 5, wherein the flexible electrical coupler is at least one of: a FPC soldered to each unit substrate, a conductive poron tape, a conductive tape, and a flexible metallic material.

7. The flexible electronic device of claim 6, wherein the unit substrates are coupled using a subsidiary coupler.

8. The flexible electronic device of claim 7, wherein the flexible electrical coupler is a FPC, and the subsidiary coupler comprises at least one of a conductive poron tape, a conductive tape, and a flexible metallic material.

9. The flexible electronic device of claim 7, wherein the subsidiary coupler is electrically coupled to a ground of the unit substrate, and used as an extended ground of the substrate.

10. The flexible electronic device of claim 1, wherein the battery pack is constructed by electrically coupling a plurality of unit battery cells, spaced at regular intervals using a flexible electrical coupler and configured to move relative to one another.

11. The flexible electronic device of claim 10, wherein the electrical coupler is coaxial cable.

12. The flexible electronic device of claim 10, wherein an outermost battery cell of the plurality of unit battery cells further comprises an access port configured to electrically couple to the electronic device.

13. The flexible electronic device of claim 10, wherein the battery pack is embedded in the electronic device, or attached to the electronic device.

14. The flexible electronic device of claim 10, further comprising:

a sealing member covering the unit battery cells, wherein the sealing member is formed of at least one of rubber, silicon, and urethane.

15. The flexible electronic device of claim 1, wherein the electronic device is a mobile communication terminal.

16. A flexible electronic device comprising:

a case frame, comprising a plurality of unit case frames intercoupled at regular intervals and the unit case frames configured to move relative to one another;

a substrate, disposed in an inner space defined by the case frame, comprising a plurality of unit substrates intercoupled at the regular intervals using a flexible electrical coupler, the unit substrates configured to move relative to one another;

a battery pack, disposed in the inner space, comprising a plurality of unit battery cells intercoupled at the regular intervals using a flexible electrical connector, the unit battery cells configured to move relative to one another; and a flexible display, coupled to the case frame and positioned so that a display surface of the flexible display is exposed, wherein each of the plurality of unit case frames comprises:

a flat surface;

a first side surface and an opposing second side surface, each side surface extending perpendicularly from side-distal ends of the flat surface;

a coupler, protruding from a top-distal end of the flat surface; and a seating end, recessing from a bottom-distal end of the flat surface, the seating end formed in opposition to the coupler, wherein the coupler of a first of the plurality of intercoupled unit case frames is configured to at least partially couple with a step formed between the bottom-distal end and the seating end of a second of the plurality of intercoupled unit case frames that is adjacent to the first of the plurality.

17. The flexible electronic device of claim 16, wherein the unit case frames, the unit substrates and the unit battery cells are disposed correspondingly.

18. The flexible electronic device of claim 1, wherein the damping member circumferentially encloses an entirety of the edge of the flexible display, such that the flexible display is nonadjacently coupled to the flexible case frame.

* * * * *